(12) United States Patent
Nakamura et al.

(10) Patent No.: US 11,851,919 B2
(45) Date of Patent: Dec. 26, 2023

(54) DOOR HANDLE

(71) Applicant: ALPS ALPINE CO., LTD., Tokyo (JP)

(72) Inventors: Toshiki Nakamura, Miyagi (JP); Takashi Sasaki, Miyagi (JP); Yoshiyuki Kikuchi, Miyagi (JP); Yuzuru Kawana, Miyagi (JP); Heishiro Fudo, Miyagi (JP); Yukimitsu Yamada, Miyagi (JP); Hiroshi Shigetaka, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 847 days.

(21) Appl. No.: 16/918,317

(22) Filed: Jul. 1, 2020

(65) Prior Publication Data
US 2020/0331328 A1    Oct. 22, 2020

Related U.S. Application Data

(63) Continuation of application No. PCT/JP2018/041019, filed on Nov. 5, 2018.

(30) Foreign Application Priority Data

Jan. 17, 2018    (JP) .................................. 2018-005641

(51) Int. Cl.
*E05B 81/76*    (2014.01)
*B60J 5/04*    (2006.01)
(Continued)

(52) U.S. Cl.
CPC ................ *E05B 81/77* (2013.01); *B60J 5/04* (2013.01); *E05B 85/16* (2013.01); *H03K 17/955* (2013.01)

(58) Field of Classification Search
CPC .... B60J 5/04; B60J 5/0493; B60J 5/10; E05B 81/77; E05B 81/78; E05B 85/10; E05B 85/16
(Continued)

(56) References Cited

U.S. PATENT DOCUMENTS 7,091,823 B2 * 8/2006 Ieda .................... H03K 17/955
292/336.3
8,382,170 B2   2/2013 Ieda et al.
(Continued)

FOREIGN PATENT DOCUMENTS

| CN | 101167000 | 4/2008 |
|----|-----------|--------|
| CN | 104453493 | 3/2015 |

(Continued)

OTHER PUBLICATIONS

Office Action dated Feb. 28, 2022 issued with respect to the corresponding Chinese Patent Application No. 201880086740.8.
(Continued)

*Primary Examiner* — Jason S Daniels
(74) *Attorney, Agent, or Firm* — IPUSA, PLLC

(57) ABSTRACT

A door handle includes a door handle case and an electrostatic sensor provided in the door handle case. The electrostatic sensor includes a detection electrode that is formed of a flat conductor plate, or that is formed on a surface of a flat substrate or within a flat substrate. The detection electrode includes a middle portion in a longitudinal direction of the detection electrode and includes peripheral portions proximal to both end portions of the detection electrode in the longitudinal direction. For a width of the detection electrode in a direction perpendicular to the longitudinal direction, each peripheral portion is wider than the middle portion, and the width of the detection electrode gradually increases toward each end portion in the longitudinal direction.

11 Claims, 16 Drawing Sheets

(51) Int. Cl.
*E05B 85/16* (2014.01)
*H03K 17/955* (2006.01)

(58) Field of Classification Search
USPC .......................................... 296/146.4, 146.5
See application file for complete search history.

(56) References Cited

U.S. PATENT DOCUMENTS

| | | | |
|---|---|---|---|
| 9,753,172 | B2 | 9/2017 | Tsuji et al. |
| 9,948,295 | B2 | 4/2018 | Bextermoeller et al. |
| 2005/0068712 | A1 | 3/2005 | Schulz et al. |
| 2005/0285717 | A1* | 12/2005 | Ieda ..................... E05B 81/78 340/5.72 |
| 2008/0079537 | A1* | 4/2008 | Touge ................... E05B 81/78 340/5.72 |
| 2014/0238834 | A1* | 8/2014 | Heim ..................... H01H 1/06 200/600 |
| 2017/0194960 | A1* | 7/2017 | Bextermoeller ........ E05B 81/77 |
| 2017/0235008 | A1* | 8/2017 | Guibbert ............. H03K 17/955 324/679 |
| 2020/0225269 | A1* | 7/2020 | Fujiyoshi ................ E05B 81/77 |
| 2023/0212892 | A1* | 7/2023 | Scheiern ............ G01R 27/2611 292/336.3 |

FOREIGN PATENT DOCUMENTS

| | | |
|---|---|---|
| CN | 106414877 | 2/2017 |
| JP | 2004-092027 | 3/2004 |
| JP | 2007-270516 | 10/2007 |
| JP | 2009-030359 | 2/2009 |
| JP | 2016-100099 | 5/2016 |
| JP | 2017-524904 | 8/2017 |
| WO | 2006/092627 | 9/2006 |

OTHER PUBLICATIONS

Extended European Search Report dated Sep. 2, 2021 issued with respect to the corresponding European Patent Application No. 18900638.0.
International Search Report for PCT/JP2018/041019 dated Jan. 15, 2019.
Chinese Office Action for 201880086740.8 dated Jan. 4, 2021.

* cited by examiner

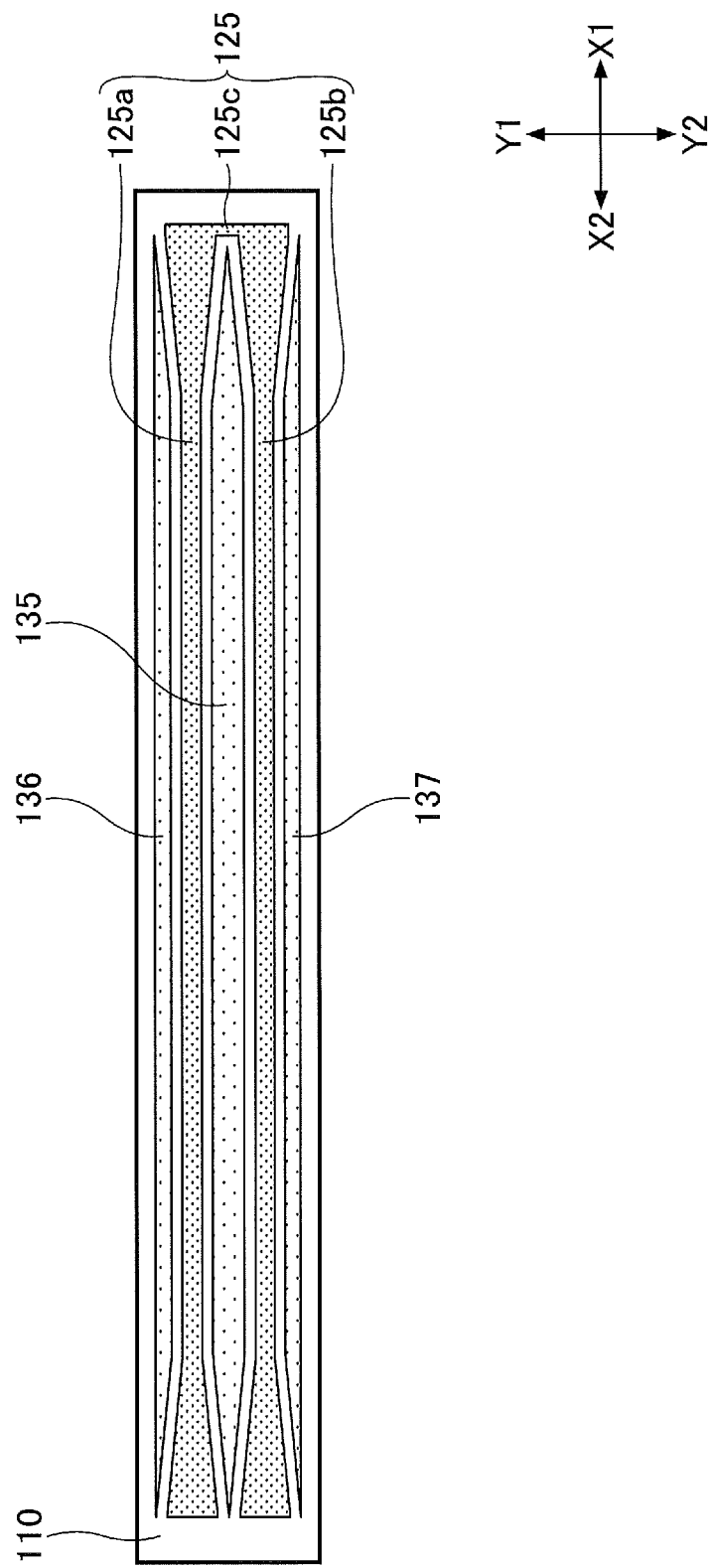

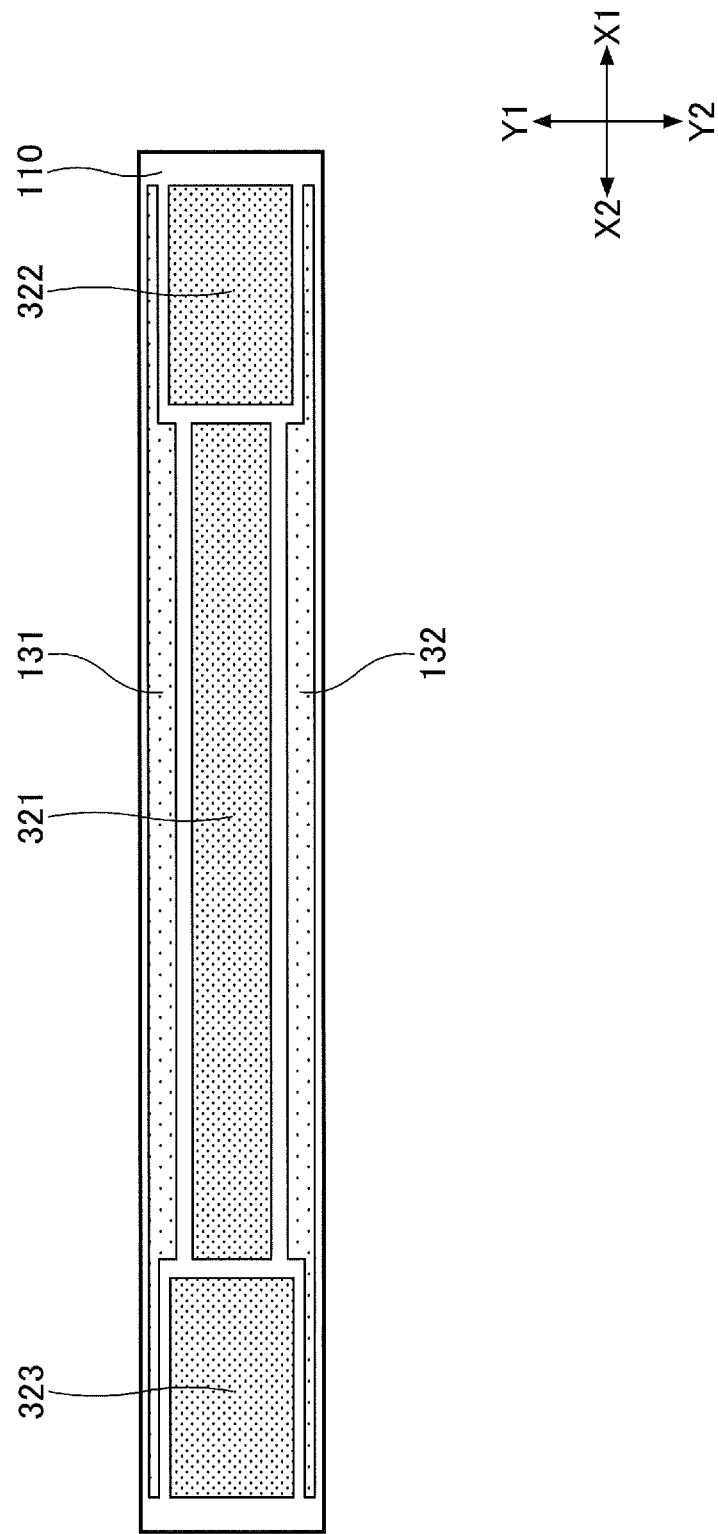

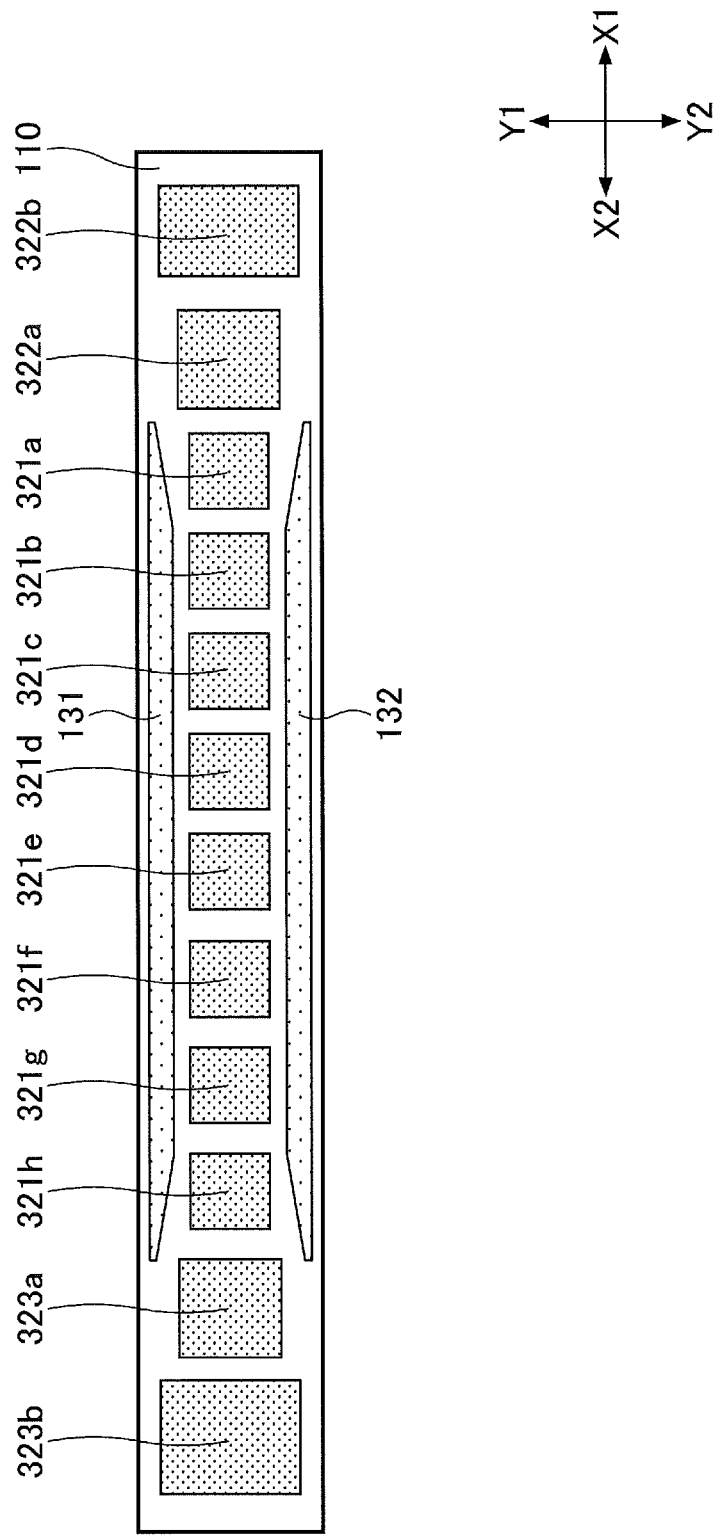

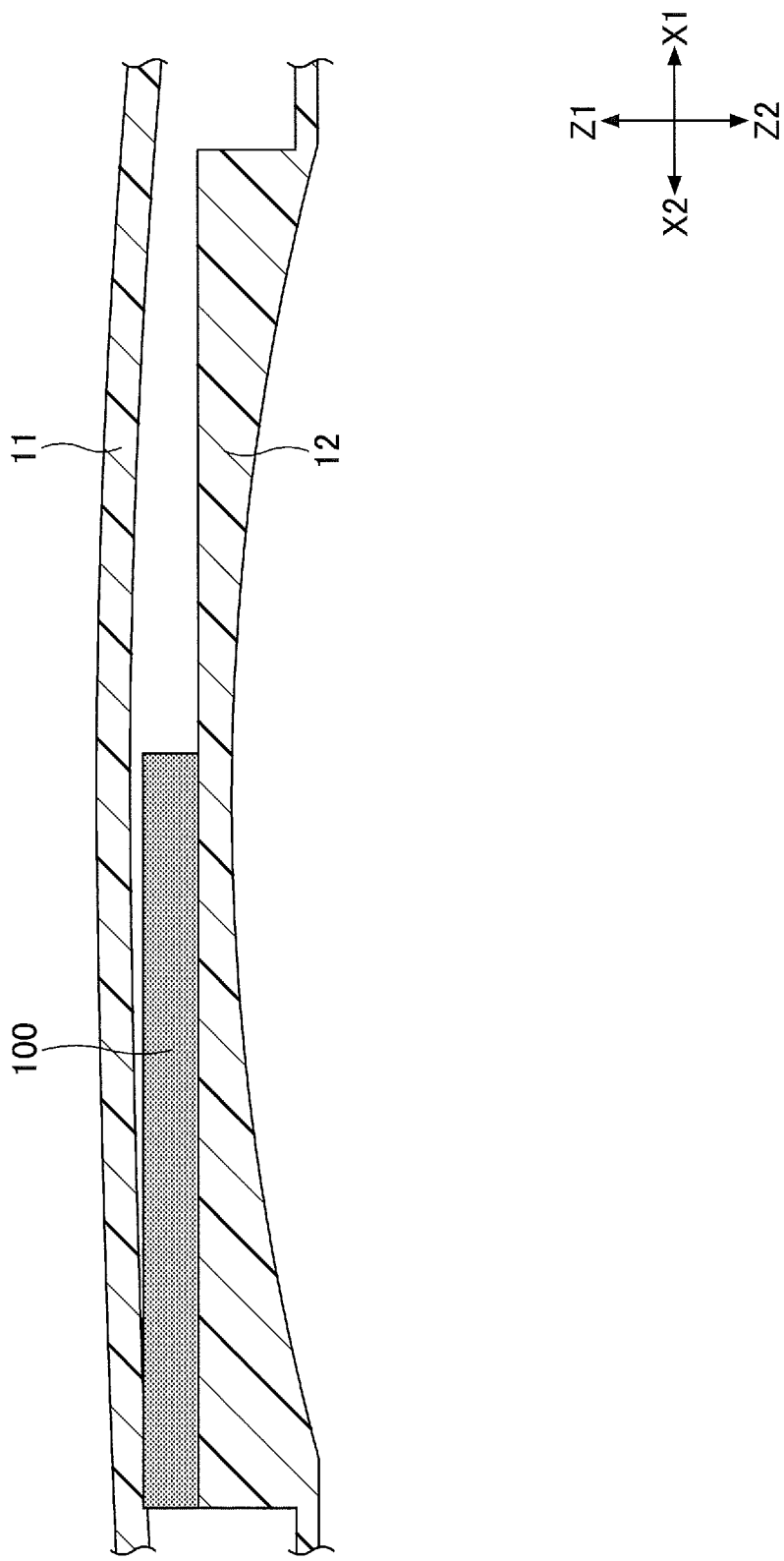

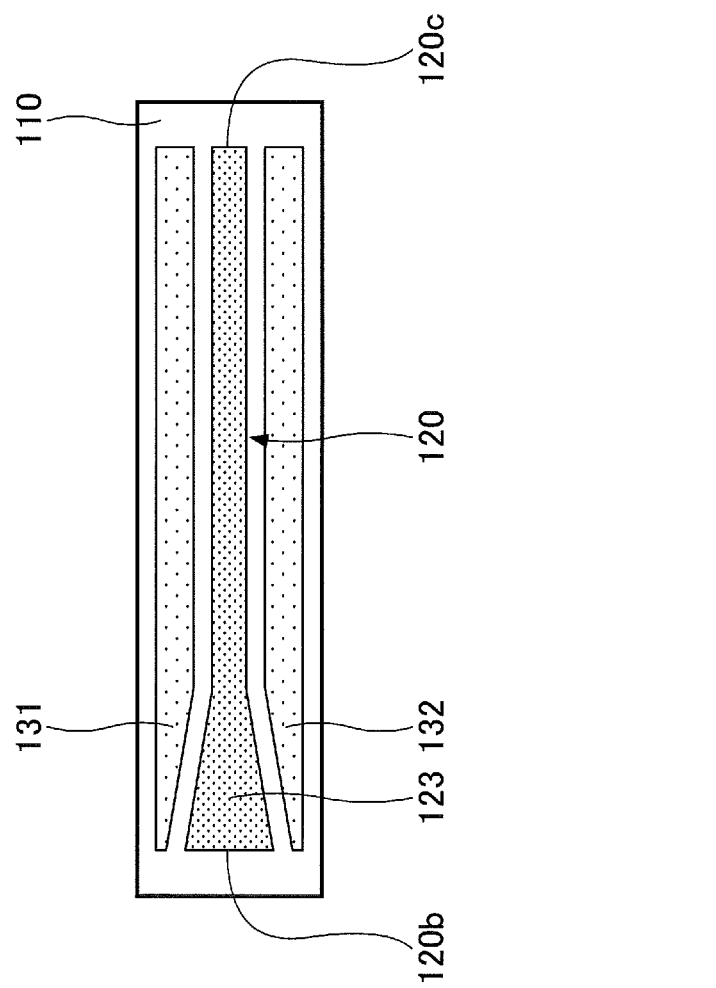

DOOR HANDLE

CROSS-REFERENCE TO RELATED APPLICATION

This application is a continuation application of International Application No. PCT/JP2018/041019, filed Nov. 5, 2018, and designated the U.S., which claims priority to Japanese Patent Application No. 2018-005641, filed Jan. 17, 2018, the contents of which are incorporated herein in their reference.

BACKGROUND OF THE INVENTION

1. Field of the Invention

The present disclosure relates to a door handle.

2. Description of the Related Art

Door handles for opening and closing of a door are each provided on the doors for a vehicle or the like. In recent years, some doors have been able to be locked or be unlocked by a gesture operation through a hand that is moved closely to the door handle. An electrostatic sensor or the like used in detection through a hand operation is provided within the door handle (see Japanese Unexamined Patent Application Publication No. 2007-270516).

SUMMARY

According to one or more embodiments, a door handle includes a door handle case and an electrostatic sensor provided in the door handle case. The electrostatic sensor includes a detection electrode that is formed of a flat conductor plate, or that is formed on a surface of a flat substrate or within a flat substrate. The detection electrode includes a middle portion in a longitudinal direction of the detection electrode and includes peripheral portions proximal to both end portions of the detection electrode in the longitudinal direction. For a width of the detection electrode in a direction perpendicular to the longitudinal direction, each peripheral portion is wider than the middle portion, and the width of the detection electrode gradually increases toward each end portion in the longitudinal direction.

BRIEF DESCRIPTION OF THE DRAWINGS

FIG. 12 is a diagram for explaining an electrostatic sensor according to modification 3 of the present embodiment;

FIG. 13 is a diagram for explaining an electrostatic sensor according to modification 4 of the present embodiment;

FIG. 14 is a diagram for explaining an electrostatic sensor according to modification 5 of the present embodiment;

FIG. 15 is a diagram (1) for explaining an electrostatic sensor according to modification 6 of the present embodiment; and FIG. 16 is a diagram (2) for explaining the electrostatic sensor according to modification 6 of the present embodiment.

DESCRIPTION OF THE EMBODIMENTS

Related art information relevant to the present disclosure recognized by the inventors of this application will be provided below. The inner surface of a door handle that contacts a person's hand or the like forms a curved surface, so as to be easily grabbed by one or more person's hand fingers or the like. However, when the inner surface of the door handle is formed with the curved surface, a distance between the inner surface of the door handle and an electrode of an electrostatic sensor varies with locations. At a portion at which the distance between the inner surface of the door handle and the electrode of the electrostatic sensor increases, detection sensitivity of the electrostatic sensor decreases and thus there are cases where the hand's fingers or the like cannot be accurately detected.

For this reason, even at the portion at which the distance between the inner surface of the door handle and the electrode of the electrostatic sensor increases, without reducing detection sensitivity of the electrostatic sensor, the door handle is required to allow for detection sensitivity similar to that obtained with respect to a portion at which the distance between the inner surface of the door handle and the electrode of the electrostatic sensor decreases. In other words, the door handle for allowing predetermined detection sensitivity to be obtained with respect to the inner surface of the door handle that contacts the person's hand, is required, regardless of a location being contacted.

According to the door handle described below, predetermined detection sensitivity can be obtained with respect to an inner surface of a door handle that contacts a person's hand, regardless of a location being contacted.

One or more embodiments will be hereinafter described. Note that the same components and the like denote the same numerals; accordingly, explanation for the components will be omitted. Note that in the present application, the X1-X2 direction, the Y1-Y2 direction, and the Z1-Z2 direction are perpendicular to each other. Further, a plane including the X1-X2 direction and the Y1-Y2 direction is referred to as an XY plane, a plane including the Y1-Y2 direction and the Z1-Z2 direction is referred to as a YZ plane, and a plane including the Z1-Z2 direction and the X1-X2 direction is referred to as a ZX plane.

(Door Handle)

Figure 1:
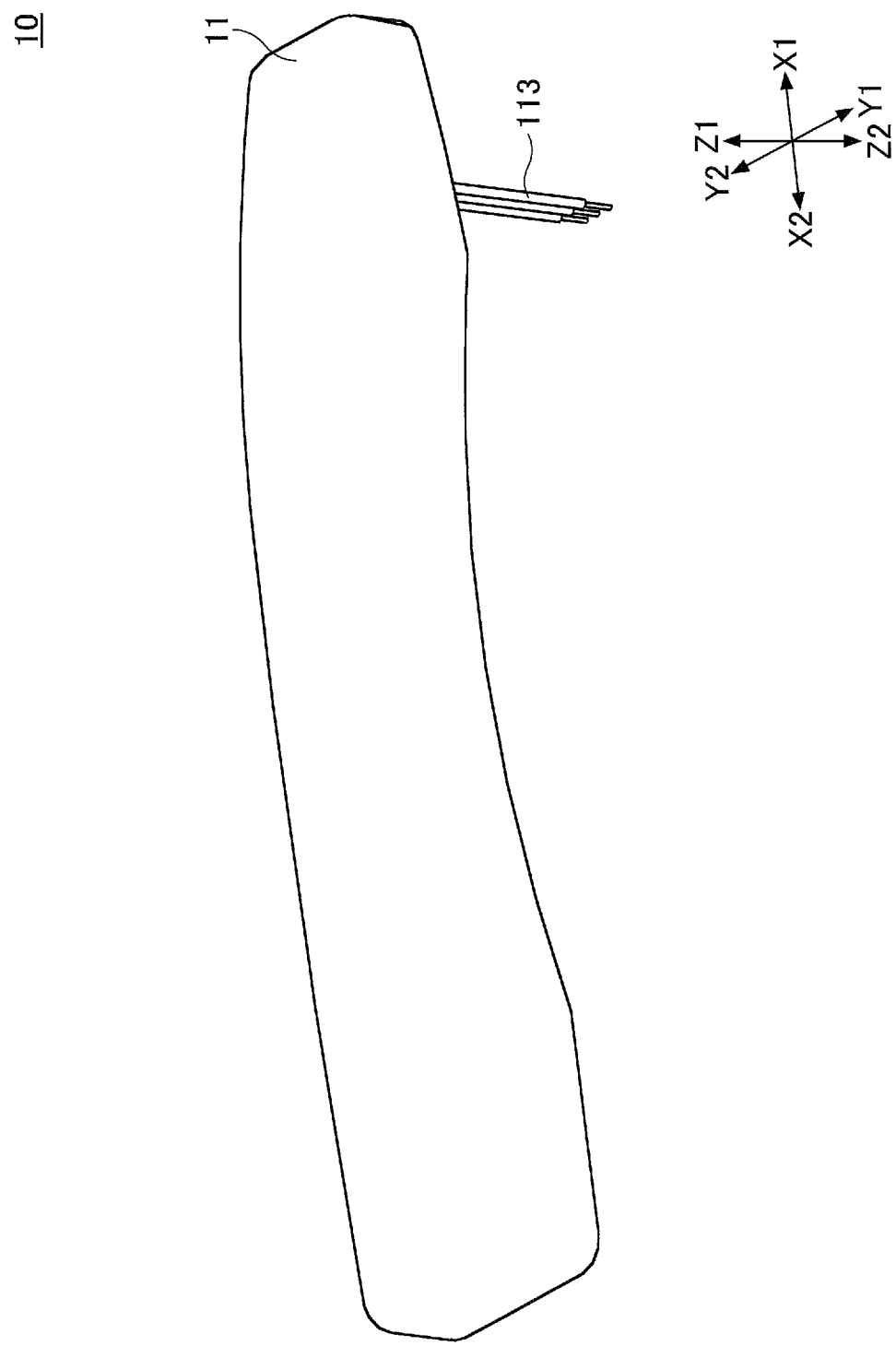
FIG. 1 is a perspective view of a door handle according to the present embodiment.
Figure 2:
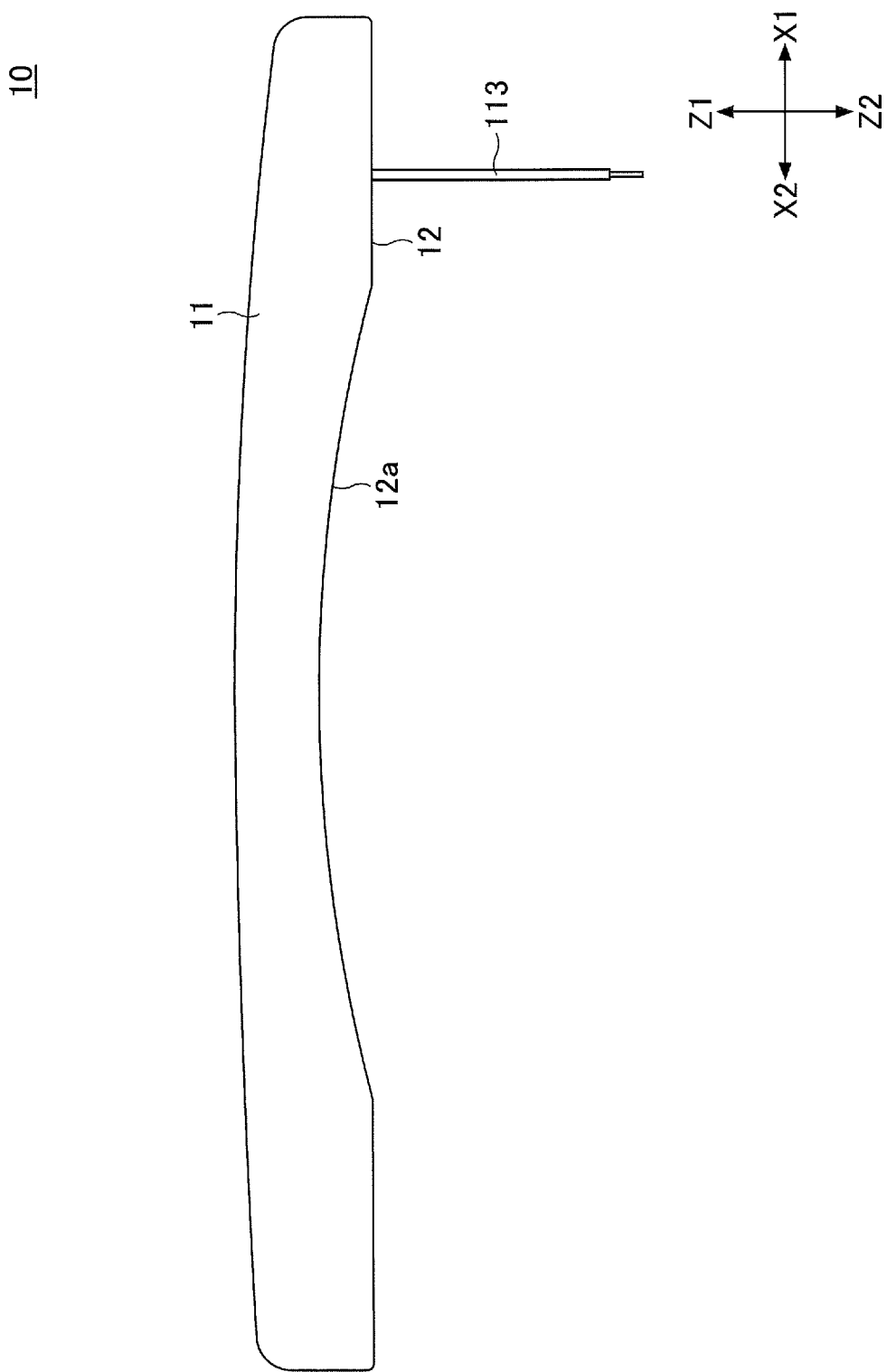
FIG. 2 is a top view of the door handle according to the present embodiment.
Figure 3:
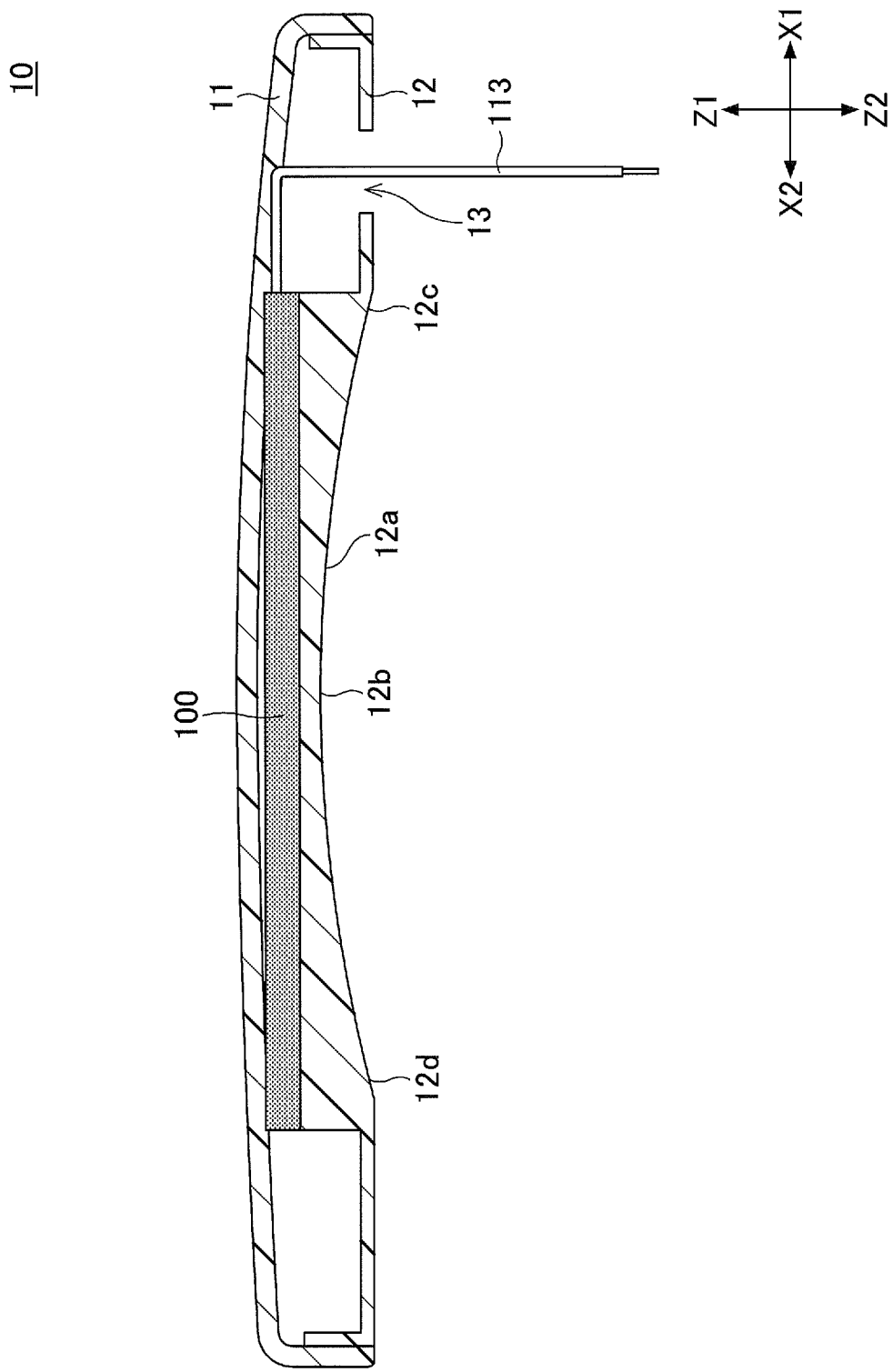
FIG. 3 is a cross-sectional view of the door handle according to the present embodiment.
Figure 4:
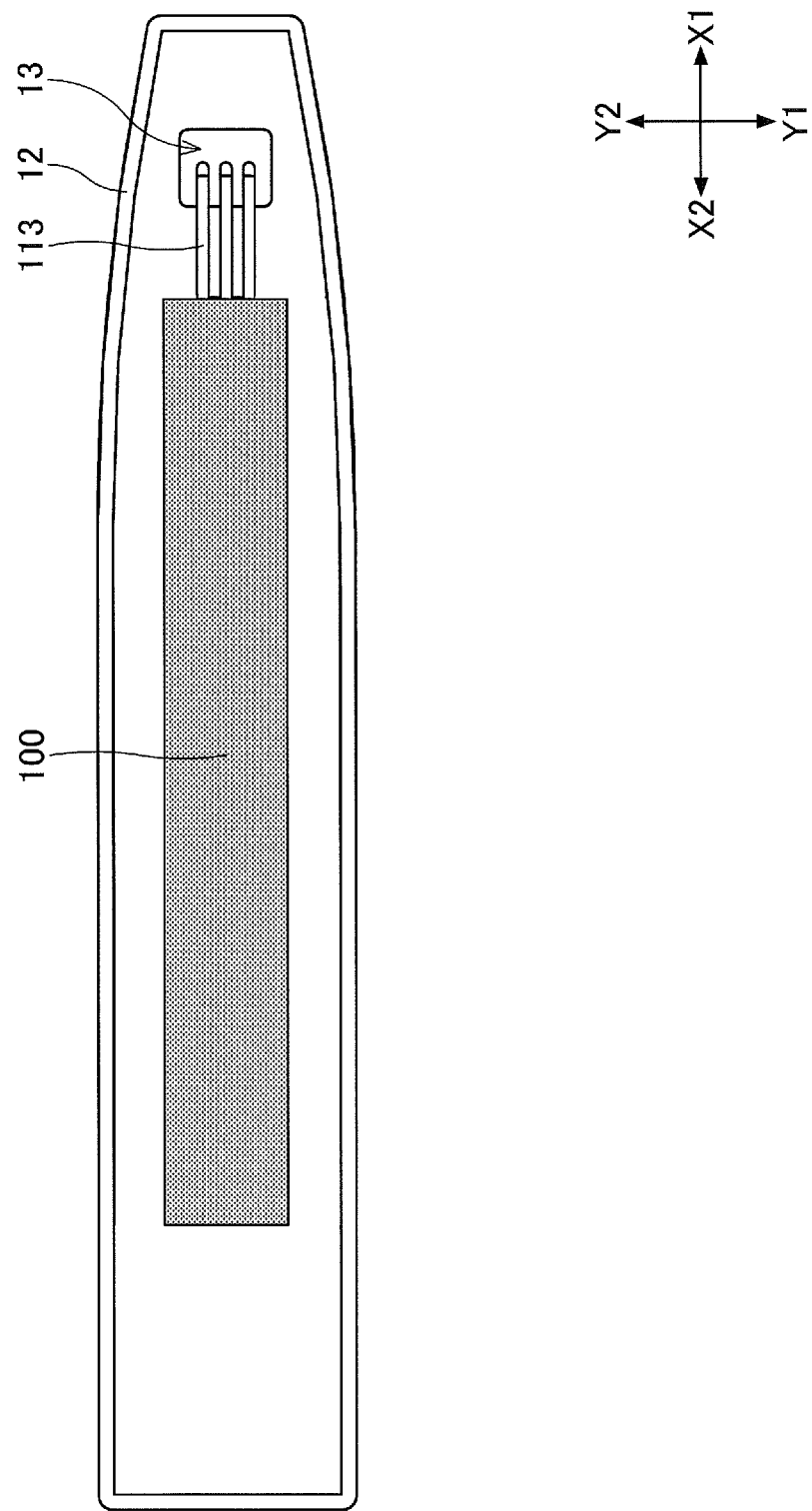
FIG. 4 is a diagram illustrating an internal structure of the door handle according to the present embodiment.

A door handle 10 will be described with reference to FIGS. 1 to 4. FIG. 1 is a perspective view of the door handle 10, FIG. 2 is a top view thereof, FIG. 3 is a cross-sectional view thereof, and FIG. 4 is a front view thereof in a state where a first door handle case 11 is removed.

The door handle 10 is attached to the exterior of a door of a vehicle such as an automobile. A door handle case that is a housing portion of the door handle 10 is formed with a first door handle case 11 and a second door handle case 12. For the door handle 10, an electrostatic sensor 100 is covered by the first door handle case 11 and the second door handle case 12, and the electrostatic sensor 100 is provided within the door handle 10. Note that a through-hole 13 is provided through the second door handle case 12 in order to pass wirings 113 and the like connected to the electrostatic sensor 100. The wirings 113 are provided for electrically connecting the electrostatic sensor 100 to the exterior of the door handle 10.

In the electrostatic sensor 100, electrodes for detecting capacitance are formed on the surface of a flat substrate formed of an insulator, or within a flat substrate formed of an insulator. The substrate of the electrostatic sensor 100 is formed to have an approximately rectangular shape. When the longitudinal direction of the door handle 10 is the X1-X2 direction, the longitudinal direction of the substrate of the electrostatic sensor 100 within the door handle 10 is also the X1-X2 direction. The substrate surface of the substrate of the electrostatic sensor 100 is approximately parallel to the X-Y direction. Note that the electrostatic sensor 100 may be formed of a conductive plate such as a metallic plate, or may be a sensor in which a flexible substrate such as FPC (flexible printed circuits) is retained flatly.

In the door handle 10 having such a structure, in order to allow the door handle 10 to be easily grabbed through the person's hand fingers or the like, an inner surface 12a of the door handle case is formed with a middle portion 12b that forms a concave curved surface that is concave toward the Z1 side. The surface 12a is a part of a grip section that the fingers or the like contact. In the present application, the Z2-side surface 12a of the second door handle case 12 may be referred to as the inner surface 12a of the door handle, or the inner surface 12a of the door handle case.

Figure 5:
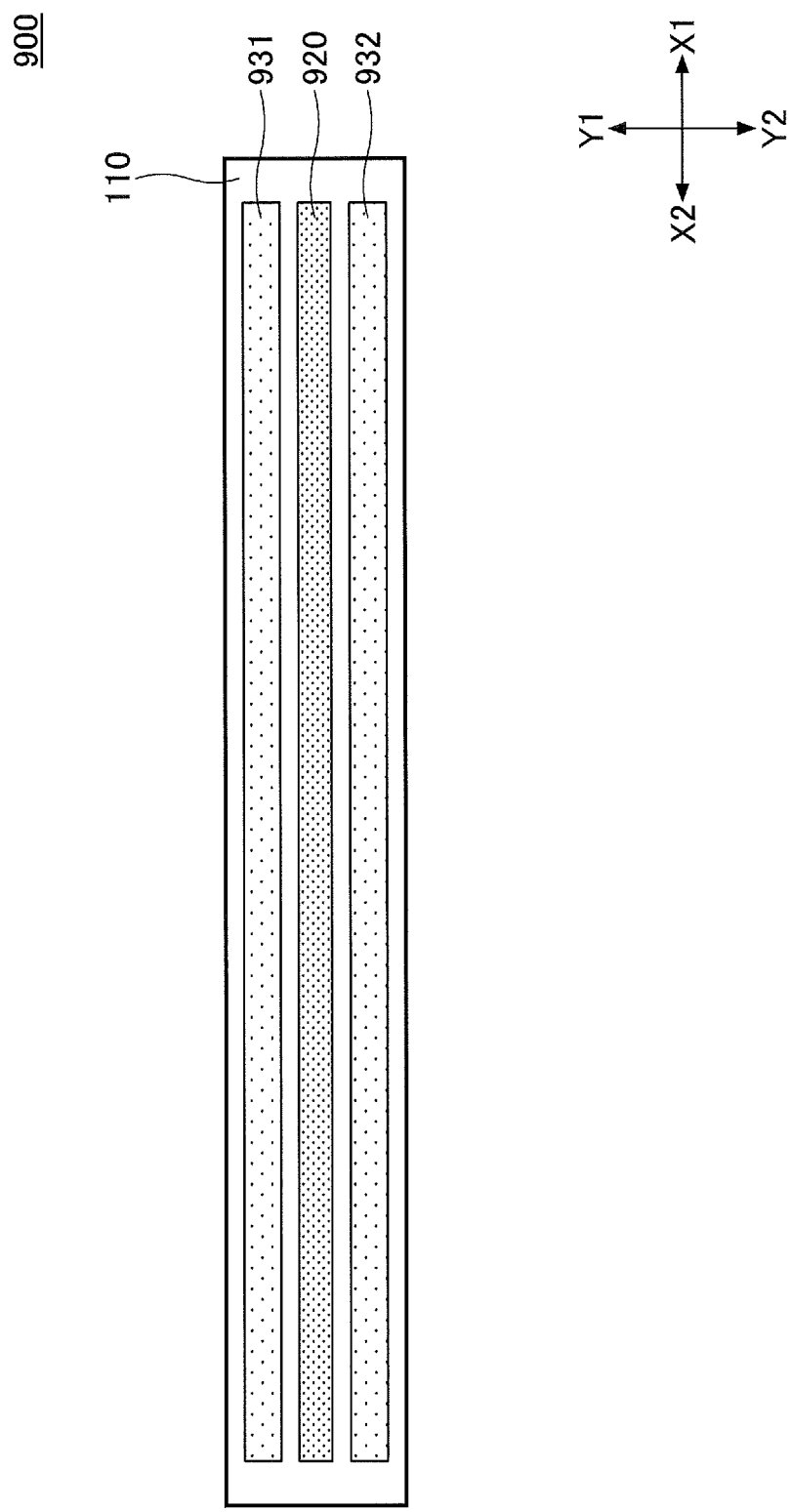
FIG. 5 is a diagram illustrating a structure of an electrostatic sensor.

Now, a case where an electrostatic sensor 900 illustrated in FIG. 5 is provided within the door handle is considered. In the electrostatic sensor 900, a detection electrode 920, and guard electrodes 931 and 932 are formed on the surface or the like of a rectangular substrate 110 of which the longitudinal direction is the X1-X2 direction. The detection electrode 920 is formed at a middle portion of the substrate in the Y1-Y2 direction, such that the longitudinal direction of the detection electrode is the X1-X2 direction. The guard electrode 931 is formed on the Y1 side of the detection electrode 920, such that the longitudinal direction of the guard electrode is the X1-X2 direction. The guard electrode 932 is formed on the Y2 side of the detection electrode 920, such that the longitudinal direction of the guard electrode is the X1-X2 direction. In the electrostatic sensor 900, the width of the detection electrode 920 in the Y1-Y2 direction is constant, and the electrostatic sensor 900 is formed to have an elongated shape in the X1-X2 direction.

As described above, with respect to the substrate 110 of the electrostatic sensor 900, the detection electrode 920 of which the longitudinal direction is the X1-X2 direction is formed. According to a change in capacitance between the detection electrode 920 of the electrostatic sensor 900 and the hand fingers or the like, contact of the hand fingers or the like with the inner surface 12a of the door handle can be detected. The capacitance detected by the electrostatic sensor 900 depends upon the distance between the detection electrode 920 of the electrostatic sensor 900 and the hand fingers or the like. The capacitance increases with decreasing distance between the detection electrode 920 of the electrostatic sensor 900 and the hand fingers or the like. The capacitance decreases with increasing distance between the detection electrode 920 of the electrostatic sensor 900 and the hand fingers or the like. When the capacitance detected by the electrostatic sensor 900 increases, contact of the hand fingers or the like with the inner surface 12a of the door handle can be accurately detected, because detection sensitivity increases. In contrast, when the capacitance detected by the electrostatic sensor 900 decreases, contact of the hand fingers or the like with the inner surface 12a of the door handle cannot be accurately detected, because detection sensitivity decreases.

Figure 6:
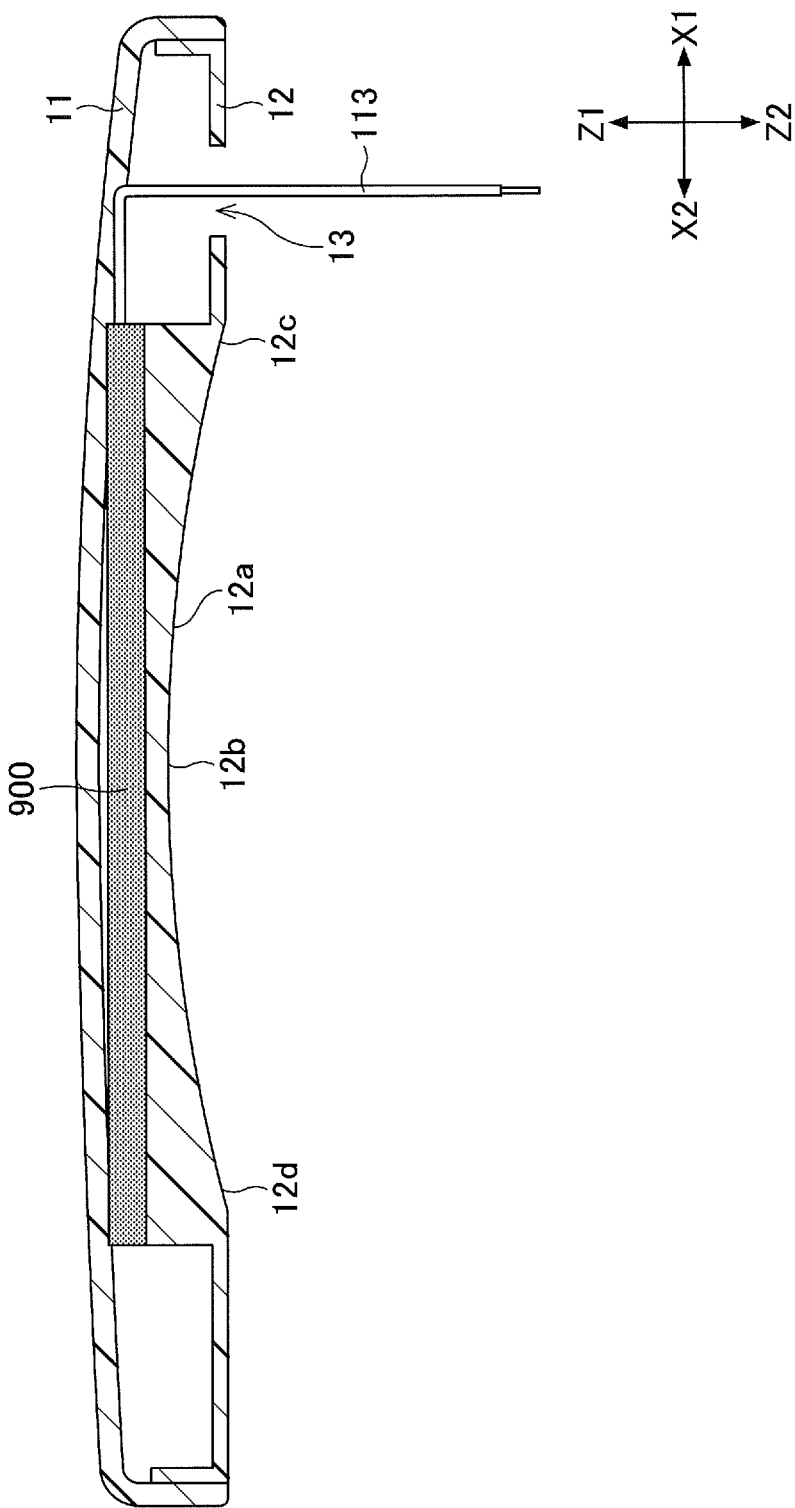
FIG. 6 is a cross-sectional view of the door handle using the electrostatic sensor illustrated in FIG. 5.

Specifically, explanation will be provided with reference to the cross-sectional view of the door handle illustrated in FIG. 6. The door handle illustrated in FIG. 6 is provided with the electrostatic sensor 900 illustrated in FIG. 5. At the middle portion 12b at which the inner surface 12a of the door handle is curved most inwardly toward the Z1 side, the distance between the inner surface 12a of the door handle and the electrostatic sensor 900 decreases. In such a manner, at the portion at which the distance between the inner surface 12a of the door handle and the electrostatic sensor 900 decreases, when the hand fingers or the like contact the middle portion 12b of the inner surface 12a of the door handle, the hand fingers or the like can be, detected with high detection sensitivity, because the distance between the electrode of the electrostatic sensor 900 and the hand fingers or the like decreases.

However, at a peripheral portion 12c proximal to an X1-side end portion of the inner surface 12a of the door handle; and a peripheral portion 12d proximal to an X2-side end portion of the inner surface 12a of the door handle, the distance between the inner surface 12a of the door handle and the electrostatic sensor 900 increases. For this reason, when the hand fingers or the like contact the peripheral portions 12c and 12d of the inner surface 12a of the door handle, the change in capacitance decreases and thus detection sensitivity is reduced. Accordingly, there are cases where contact of the hand fingers or the like with the inner surface 12a of the door handle cannot be accurately detected.

Because the curved surface portion of the inner surface 12a of the door handle is a portion that the fingers or the like contact, there is the case of the middle portion 12b being contacted, and further, there is the case of the peripheral portions 12c and 12d being each contacted. For this reason, for the inner surface 12a of the door handle, whether at the middle portion 12b or the peripheral portions 12c and 12d, the door handle is required to allow contact of the hand fingers or the like with the inner surface 12a of the door handle to be accurately detected.

Note that if the electrostatic sensor 900 is formed to have the shape corresponding to the curved surface portion of the inner surface 12a of the door handle, the above issue would not be raised. However, because the substrate 110 of the electrostatic sensor 900 is a flat, rigid substrate formed of a glass epoxy resin or the like, bending of the substrate 110 may be extremely difficult to form a desired curved surface. Moreover, forming of an electrode pattern on the substrate having the curved surface, which is not flat, involves a very complicated process, which is time-consuming and costly. Accordingly, the door handle may become costly.

(Electrostatic Sensor)

Figure 7:
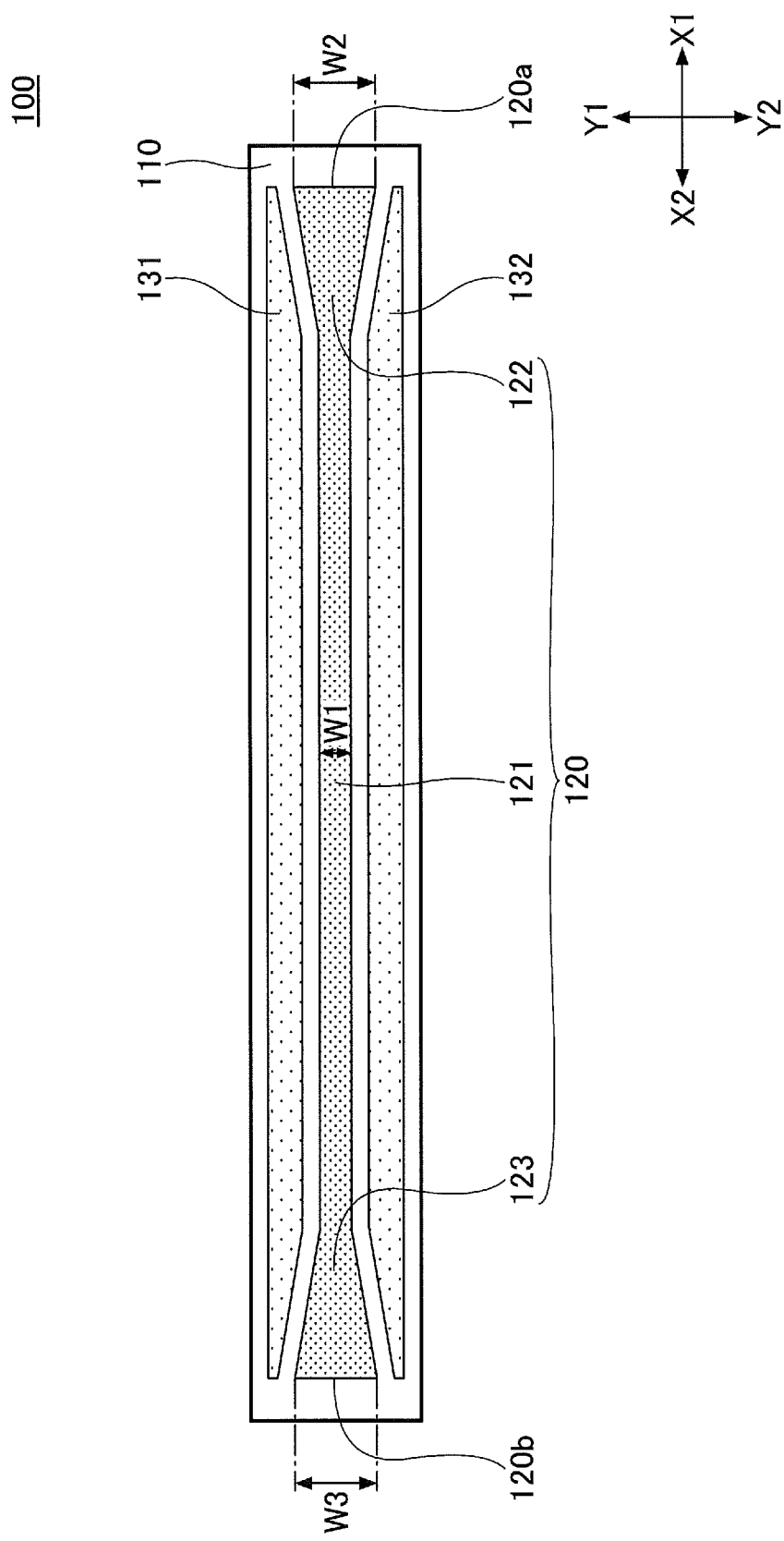
FIG. 7 is a diagram (1) for explaining the electrostatic sensor according to the present embodiment.

Hereafter, an electrostatic sensor 100 according to the present embodiment will be described with reference to FIG. 7. In the electrostatic sensor 100 according to the present embodiment, a detection electrode 120 and guard electrodes 131 and 132 are formed on the surface of a rectangular, flat substrate 110 of which the longitudinal direction is the X1-X2 direction. The detection electrode 120 is formed at the middle portion of the substrate 110 in the Y1-Y2 direction, such that the longitudinal direction of the detection electrode is the X1-X2 direction. The guard electrode 131 of which the longitudinal direction is the X1-X2 direction is formed on the Y1 side of the detection electrode 120, and the guard electrode 132 of which the longitudinal direction is the X1-X2 direction is formed on the Y2 side of the detection electrode 120. Note that the Y1-Y2 direction is the short direction perpendicular to the longitudinal direction. The detection electrode 120 and the guard electrodes 131 and 132 may be formed within the substrate 110 not being on the surface of the substrate 110.

In the electrostatic sensor 100 according to the present embodiment, for the detection electrode 120, the width of the middle portion 121 in the Y1-Y2 direction is set to be constant. However, the width of the peripheral portion 122 in the Y1-Y2 direction and in proximity to an X1-side end portion 120a gradually increases toward the X1-side end portion 120a, so that the width W2 is set at the end portion 120a. The width of the peripheral portion 123 in the Y1-Y2 direction and in proximity to an X2-side end portion 120b gradually increases toward the X2-side end portion 120b, so that the width W3 is set at the end portion 120b. In such a manner, for the width of the detection electrode 120 in the Y1-Y2 direction, the peripheral portions 122 and 123 are each wider than the middle portion 121, thereby improving the detection sensitivity with respect to each peripheral portion. Note that in the present application, the structure of being gradually expanded includes a structure in which the width of the detection electrode 120 is partially locally decreased, e.g., a structure that is not regular to the extent of a split structure as in a slight recess at one location only, and includes a structure in which other electrodes, members, or through-holes, etc. are disposed.

As given in Formula 1, the capacitance C is proportional to an electrode area S and is inversely proportional to a distance d between electrodes. Note that ε represents a dielectric constant of the second door handle case 12 or the like.

$$C = \varepsilon \frac{S}{d} \qquad \text{[Formula 1]}$$

According to the present embodiment, because the distance between the electrostatic sensor 100 and each of the respective peripheral portions 12c and 12d on the X1 side and X2 side of the inner surface 12a of the door handle case increases, the capacitance decreases. In this regard, by increasing the electrode area to compensate for the decreased capacitance, a capacitance value is set to be approximately the same, whether at the middle portion 12b of the inner surface 12a of the door handle case, the peripheral portion 12c on the X1 side, or the peripheral portion 12d on the X2 side. Thereby, reduction in the sensitivity with respect to the peripheral portions 12c and 12d is avoided. Note that for each of the guard electrodes 131 and 132, the width of each peripheral portion in the Y1-Y2 direction and in proximity to a given end portion in the X1-X2 direction decreases in accordance with the shape of a given peripheral portion from among the peripheral portions 122 and 123 of the detection electrode 120.

Figure 8:
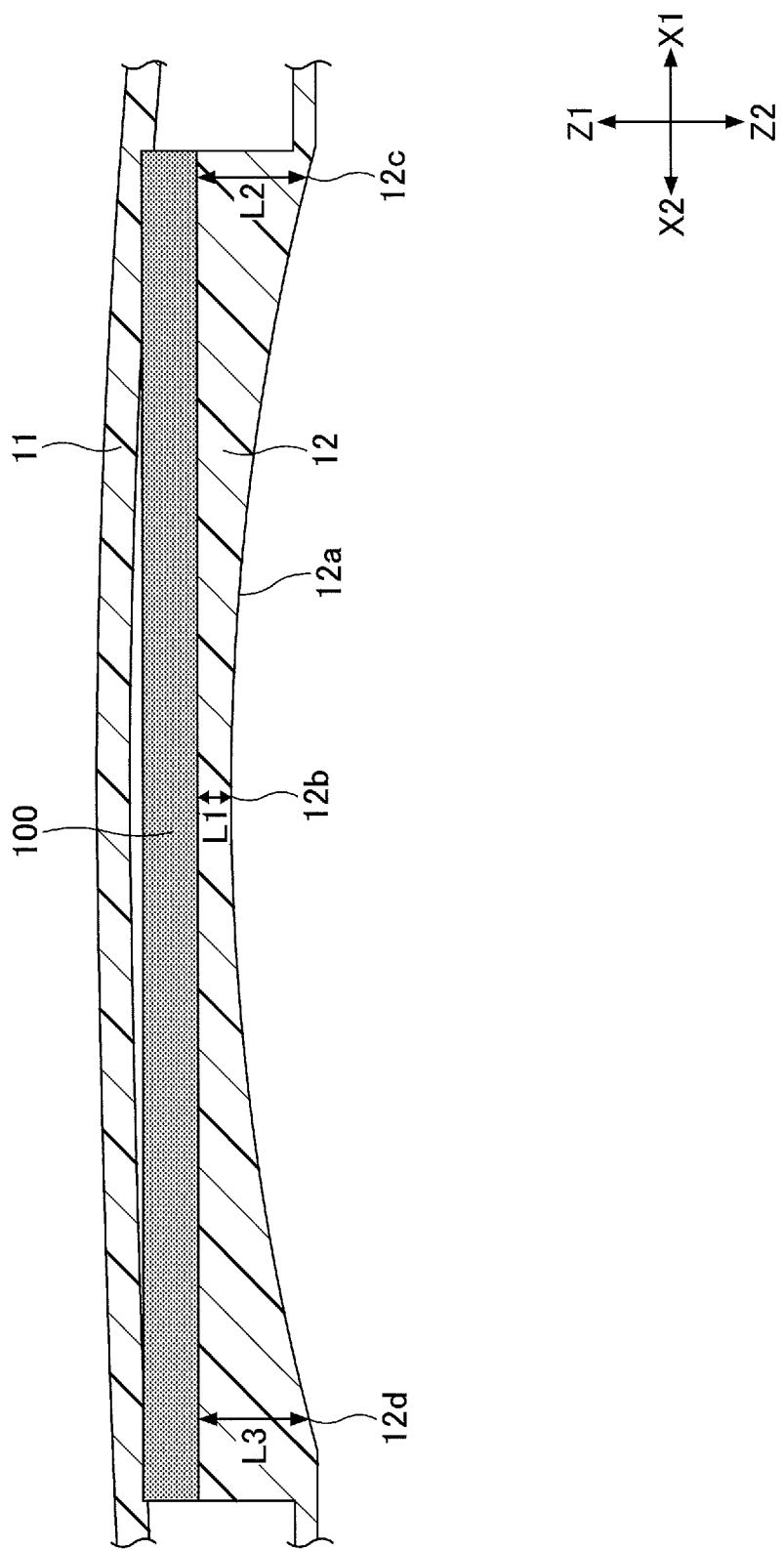
FIG. 8 is a diagram (2) for explaining the electrostatic sensor according to the present embodiment.

Specifically, as illustrated in FIG. 8, when the distance between the surface 12a at the middle portion 12b of the inner surface 12a of the door handle case and the electrostatic sensor 100 is given as L1; the width of the middle portion 121 of the detection electrode 120 in the Y1-Y2 direction is given as W1; and the distance between the surface 12a at the peripheral portion 12c of the inner surface 12a of the door handle case and the electrostatic sensor 100 is given as L2, the width W2 of the peripheral portion 122 of the detection electrode 120 in the Y1-Y2 direction, which corresponds to such a location, is set to W2≈(W1×L2)/L1. Note that the peripheral portion 12c of the inner surface 12a of the door handle case is at a location corresponding to the X1-side end portion 120a of the peripheral portion 122 of the detection electrode 120.

When the distance between the surface 12a at the peripheral portion 12d of the inner surface 12a of the door handle case and the electrostatic sensor 100 is given as L3, the width W3 of the peripheral portion 123 of the detection electrode 120 in the Y1-Y2 direction, which corresponds to such a location, is set to W3≈(W1×L3)/L1. Note that that the peripheral portion 12d of the inner surface 12a of the door handle case is at a location corresponding to the X2-side end portion 120b of the peripheral portion 123 of the detection electrode 120.

Further, according to the present embodiment, the distance L between the inner surface 12a of the door handle case and the electrostatic sensor 100 may be set to be approximately proportional to the width W of the detection electrode 120 in the Y1-Y2 direction and at a corresponding location. The distance L between the inner surface 12a of the door handle case and the electrostatic sensor 100 may be set to be approximately the same as the width W of the detection electrode 120 in the Y1-Y2 direction.

Figure 9:
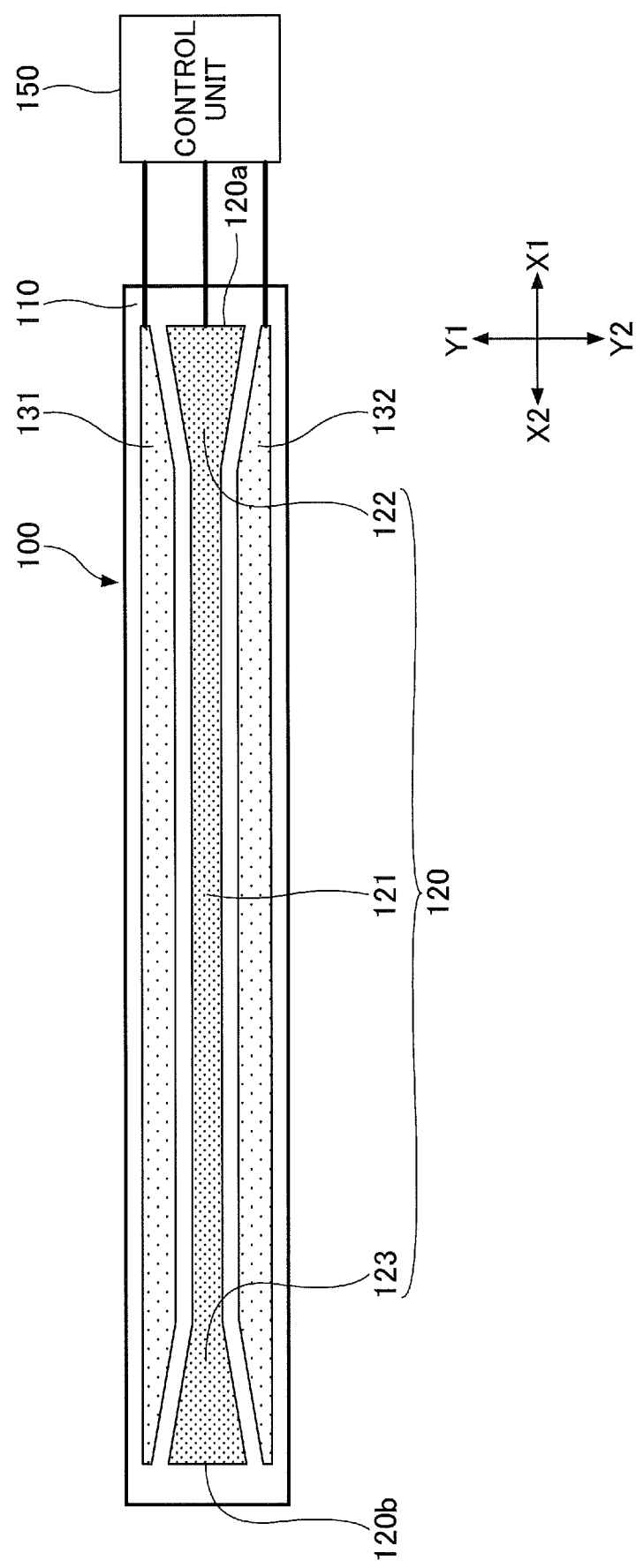
FIG. 9 is a diagram (3) for explaining the electrostatic sensor according to the present embodiment.

According to the present embodiment, as illustrated in FIG. 9, the electrostatic sensor 100 is provided with a control unit 150. The detection electrode 120 and the guard electrodes 131 and 132 are connected to the control unit 150. The control unit 150 applies a voltage supplied by the control unit 150, to the detection electrode 120 to measure the magnitude of a flow current. Thereby, the control unit 150 can measure capacitance between the detection electrode 120 and the hand fingers or the like. One potential from among a ground potential, a bias potential set at a predetermined potential, and a potential that is the same as that applied to the detection electrode 120, is applied to each of the guard electrodes 131 and 132 by the control unit 150. Note that the control unit 150 applies a voltage to the detection electrode 120 to detect capacitance, and determines whether a contact operation, a gesture operation, and the like are each performed based on the value of the detected capacitance. Further, with the guard electrodes 131 and 132 being provided, variation in the capacitance due to noise and the like is minimized. In the present embodiment, particularly, variation due to noise from the Y1-Y2 direction side, unintentional contact, or the like can be minimized.

Thus, according to the present embodiment, even at the peripheral portions 12c and 12d at each of which the distance between the inner surface 12a of the door handle 10 and the electrode of the electrostatic sensor 10 increases, without reducing the detection sensitivity of the electrostatic sensor 100, detection sensitivity similar to that with respect to the middle portion 12b can be obtained. In other words, for the inner surface 12a of the door handle 10 that contacts the person's hand, certain detection sensitivity can be obtained regardless of the location being contacted. Thereby, contact of the hand fingers or the like with the inner surface 12a of the door handle 10 can be detected, regardless of the location at which the inner surface 12a of the door handle 10 is contacted. Also, for the door handle according to the present embodiment, an electrode pattern used in the electrostatic sensor 100 is only changed whereby the door handle can be manufactured at a cost comparative with the electrostatic sensor 900 illustrated in FIG. 5.

(Modifications)

Figure 10:
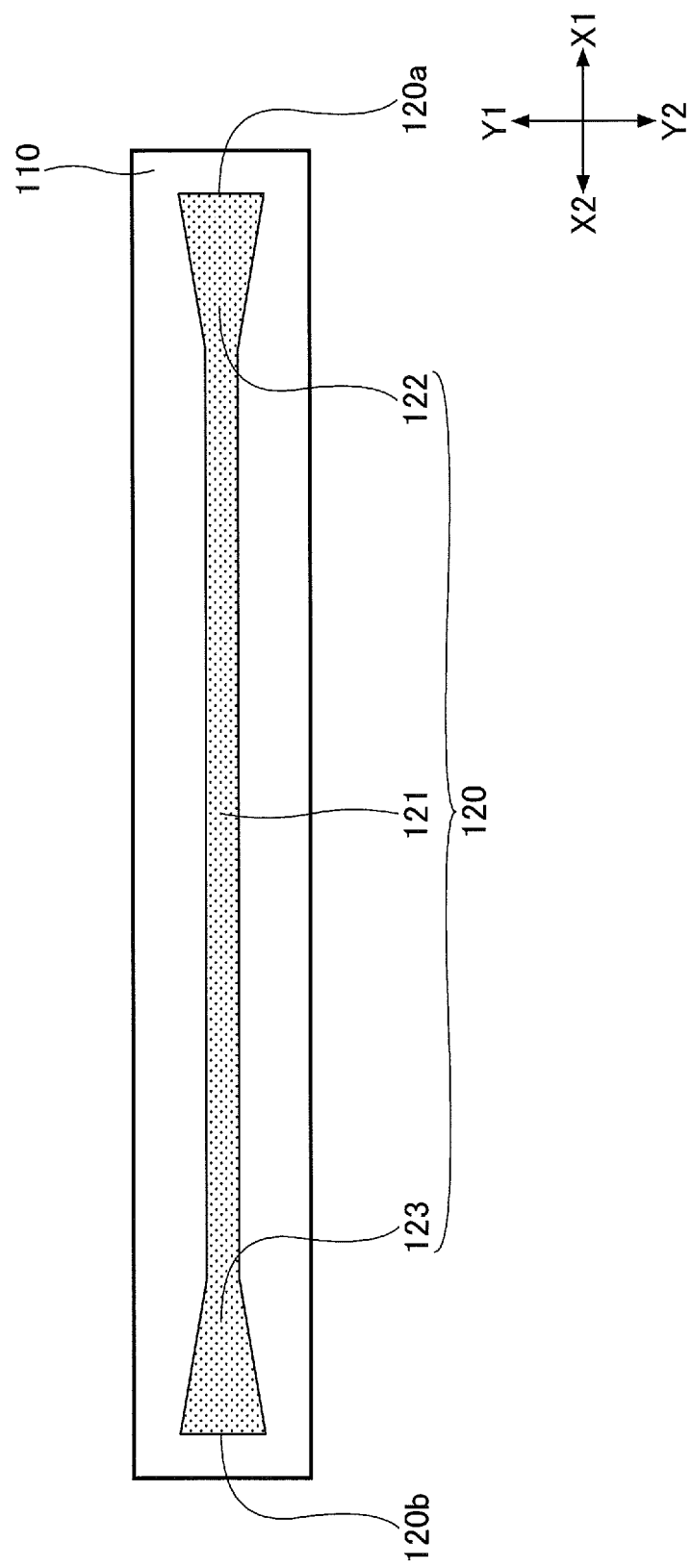
FIG. 10 is a diagram for explaining an electrostatic sensor according to modification 1 of the present embodiment.

As illustrated in FIG. 10, one embodiment may provide the structure in which only the detection electrode 120 is provided on the surface of the substrate 110, and in which the guard electrodes 131 and 132 are not provided.

Figure 11:
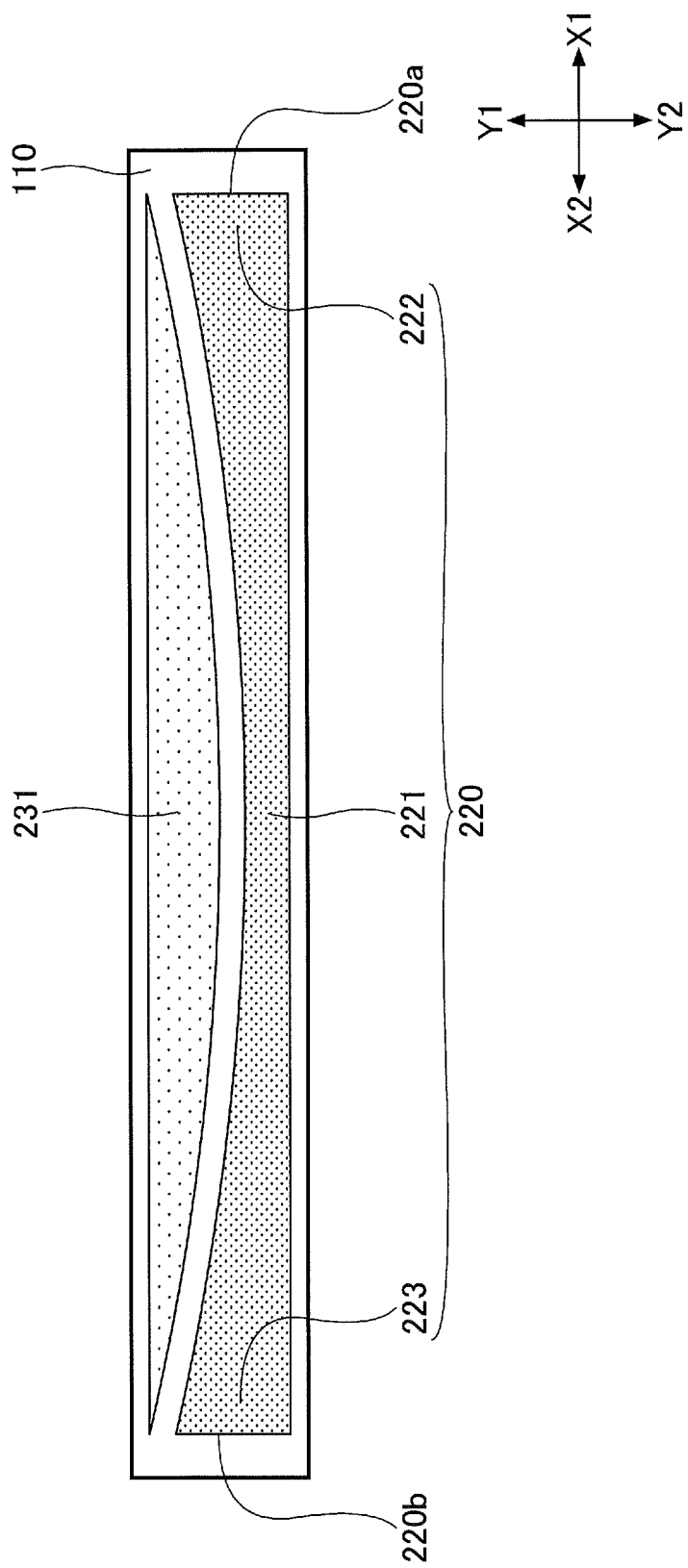
FIG. 11 is a diagram for explaining an electrostatic sensor according to modification 2 of the present embodiment.

As illustrated in FIG. 11, one embodiment may provide the structure in which a detection electrode 220 is provided on the Y2 side and a guard electrode 231 is provided on the Y1 side. The detection electrode 220 of which the longitudinal direction is the X1-X2 direction may be set such that the width of the middle portion 221 in the Y1-Y2 direction decreases, and such that the width of the detection electrode 220 in the Y1-Y2 direction gradually increases toward each of the X1-side end portion 220a and the X2-side end portion 220b. In other words, in the Y1-Y2 direction, the peripheral portion 222 proximal to the X1-side end portion 220a; and the peripheral portion 223 proximal to the X2-side end portion 220b may be each wider than the width of the middle portion 221 of the detection electrode 220 in the Y1-Y2 direction. Note that the guard electrode 231 that is formed such that the longitudinal direction of the guard electrode is the X1-X2 direction, corresponds to the shape of the detection electrode 220, and the width of the guard electrode in the Y1-Y2 direction gradually decreases toward each of the X1-side end portion and the X2-side end portion.

In one embodiment, as illustrated in FIG. 12, two electrodes each corresponding to the detection electrode 120 are formed, and the respective electrodes corresponding to the two detection electrodes 120 may be connected at the X1 side to have a U-shape. Specifically, the detection electrode 125 may have the structure in which two electrodes 125a and 125b of which the longitudinal direction is the X1-X2 direction are arranged to be ranged in the Y1-Y2 direction, and in which the electrodes 125a and 125b are connected to each other at a connection portion 125c present at the X1-side end portion. In this case, a guard electrode 135 of which the longitudinal direction is the X1-X2 direction is provided between the electrode 125a and the electrode 125b, a guard electrode 136 of which the longitudinal direction is the X1-X2 direction is provided toward the Y1 side of the electrode 125a, and a guard electrode 137 of which the longitudinal direction is the X1-X2 direction may be provided toward the Y2 side of the electrode 125a.

The detection electrode 120 may have the structure in which the middle portion and the peripheral portions are separated. Specifically, as illustrated in FIG. 13, the detection electrode may be divided into multiple portions being a middle detection electrode 321 corresponding to the middle portion 121 of the detection electrode 120; a peripheral detection electrode 322 corresponding to the X1-side peripheral portion 122; and a peripheral detection electrode 323 corresponding to the X2-side peripheral portion 123.

As illustrated in FIG. 14, the middle detection electrode 321 and the peripheral detection electrodes 322 and 323 may be further divided. In the case illustrated in FIG. 14, the middle detection electrode 321 is divided into electrodes 321a, 321b, 321c, 321d, 321e, 321f, 321g, and 321h, and the electrodes may be arranged to be ranged in the X1-X2 direction. The peripheral detection electrode 322 is divided into electrodes 322a and 322b, and the peripheral detection electrode 323 may be divided into electrodes 323a and 323b. Note that for the separated electrodes illustrated in FIGS. 13 and 14, the total of capacitance for the electrodes that are connected may be set as a detected value. Alternatively, with respect to the separated electrodes that are individually connected to the control unit 150, respective detected values may be obtained.

In one embodiment, the width of only one end portion from among the X1-side end portion and the X2-side end portion of the detection electrode 120 may be set so as to increase. Specifically, as illustrated in FIGS. 15 and 16, the structure may be provided such that the peripheral portion 123 in the Y1-Y2 direction and in proximity to the X2-side end portion 120b of the detection electrode 120 is wider than the X1-side end portion 120c opposite the end portion 120b. Note that in the present application, for the electrostatic sensor illustrated in FIG. 16, the X1-side end portion 120c of the detection electrode 120 may be referred to as one end portion, and the X2-side end portion 120b may be referred to as the other end portion.

The embodiments have been described in detail above, but are not limited to the specific embodiments. Various modifications and changes can be made within a scope set forth in the claims.

What is claimed is:

1. A door handle comprising:
a door handle case; and
an electrostatic sensor provided in the door handle case,
wherein the electrostatic sensor includes a detection electrode that is formed of a flat conductor plate, or that is formed on, a surface of a flat substrate or within, a flat substrate,
wherein the detection electrode includes a middle portion in a longitudinal direction of the detection electrode; and peripheral portions proximal to both end portions of the detection electrode in the longitudinal direction, and
wherein, for a width of the detection electrode in a direction perpendicular to the longitudinal direction, each peripheral portion is wider than the middle portion, and the width of the detection electrode gradually increases toward each end portion in the longitudinal direction,
wherein the width of the detection electrode in the direction perpendicular to the longitudinal direction is approximately proportional to a length from the electrostatic sensor to an inner surface of the door handle.

2. The door handle according to claim 1, wherein an inner surface of the door handle that contacts a person's hand is formed with a curved surface, and
wherein a length from the electrostatic sensor at each peripheral portion of the detection electrode to the inner surface of the door handle is longer than a length from the electrostatic sensor at the middle portion of the detection electrode to the inner surface of the door handle.

3. The door handle according to claim 1, wherein a longitudinal direction of the electrostatic sensor is a longitudinal direction of the door handle.

4. The door handle according to claim 1, further comprising a guard electrode that is formed to be ranged in the direction perpendicular to the longitudinal direction of the detection electrode, on the surface of the substrate or within the substrate,
wherein a ground, potential or a predetermined potential is applied to the guard electrode.

5. A door handle comprising:
a door handle case; and
an electrostatic sensor provided in the door handle case,
wherein the electrostatic sensor includes a detection electrode that is formed on a surface of a flat substrate, or within a flat substrate,
wherein the detection electrode includes one end portion and another end portion in a longitudinal direction of the detection electrode,
wherein, for a width of the detection electrode in a direction perpendicular to the longitudinal direction, the another end portion is wider than the one end portion, and the width of the detection electrode gradually increases toward the another end portion, and
wherein the width of the detection electrode in the direction perpendicular to the longitudinal direction is approximately proportional to a length from the electrostatic sensor to an inner surface of the door handle.

6. The door handle of claim 5, wherein a longitudinal direction of the electrostatic sensor is a longitudinal direction of the door handle.

7. The door handle according, to claim 5, further comprising a guard electrode that is formed to be ranged in the direction perpendicular to the longitudinal direction of the detection electrode, on the surface of the substrate or within the substrate,
wherein a ground potential or a predetermined potential is applied to the guard electrode.

8. A door handle comprising:
a door handle case including an inner surface and an outer surface; and
an electrostatic sensor provided in the door handle case, the electrostatic sensor including a detection electrode,
wherein the inner surface of the door handle case includes a middle portion that forms a concave surface, the concave surface being concave inwardly toward a side where the outer surface of the door handle case, is situated,
wherein the detection electrode is formed of a flat conductor plate, or is formed on a surface of a flat substrate or within a flat substrate, the surface of the flat substrate being approximately perpendicular to a first direction from the inner surface to the outer surface of the door handle case,
wherein the detection electrode includes
a middle portion provided along a longitudinal direction of the detection electrode,
opposite end portions in the longitudinal direction, and
peripheral portions proximal to the respective end portions, each peripheral portion being between the middle portion and a corresponding end portion among the end portions, and
wherein each peripheral portion is wider than the middle portion in a second direction perpendicular to the first direction and the longitudinal direction, and a width of the detection electrode increases toward each end portion in the longitudinal direction.

9. A door handle comprising:
a door handle case including an inner surface and an outer surface; and
an electrostatic sensor provided in the door handle case, the electrostatic sensor including a detection electrode,
wherein the inner surface of the door handle case includes a middle portion that forms a concave surface, the concave surface being concave inwardly toward a side where the outer surface of the door handle case is situated,
wherein the detection electrode is formed of a flat conductor plate, or is formed on a surface of a flat substrate or within a flat substrate, the surface of the flat substrate being approximately perpendicular to a first direction from the inner surface to the outer surface of the door handle case,
wherein the detection electrode includes a first end portion and a second end portion in a longitudinal direction of the detection electrode, and
wherein the second end portion is wider than the first end portion in a second direction perpendicular to the first direction and the longitudinal direction, and a width of the detection electrode increases toward the second end portion.

10. The door handle according to claim 8, wherein the door handle case includes a first door handle case and a second door handle case,
wherein the electrostatic sensor is provided between the first door handle case and the second door handle case, and
wherein the inner surface of the door handle case is an inner surface-side of the second door handle case, and the outer surface of the door handle case is an outer surface side of the first door handle.

11. The door handle according to claim 9, wherein the door handle case includes a first door handle case and a second door handle case,
wherein the electrostatic sensor is provided between the first door handle case and the second door handle case, and
wherein the inner surface of the door handle case is an inner surface-side of the second door handle case, and the outer surface of the door handle case is an outer surface-side of the first door handle.

* * * * *